US012787741B2

(12) United States Patent
Xu et al.

(10) Patent No.: US 12,787,741 B2
(45) Date of Patent: Nov. 3, 2026

(54) STRUCTURE WITH CAVITY AROUND THROUGH SEMICONDUCTOR VIA

(71) Applicant: GlobalFoundries U.S. Inc., Malta, NY (US)

(72) Inventors: Dewei Xu, Clifton Park, NY (US); Ravi Prakash Srivastava, Clifton Park, NY (US); Zhuojie Wu, Port Chester, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 510 days.

(21) Appl. No.: 18/340,174

(22) Filed: Jun. 23, 2023

(65) Prior Publication Data

US 2024/0429127 A1 Dec. 26, 2024

(51) Int. Cl.

| | |
|---|---|
| ***H10W 20/20*** | (2026.01) |
| ***H10W 20/00*** | (2026.01) |
| ***H10W 20/46*** | (2026.01) |
| ***H10W 20/48*** | (2026.01) |

(52) U.S. Cl.
CPC ......... *H10W 20/20* (2026.01); *H10W 20/023* (2026.01); *H10W 20/072* (2026.01); *H10W 20/46* (2026.01); *H10W 20/48* (2026.01)

(58) Field of Classification Search
CPC . H10W 20/20; H10W 20/023; H10W 20/072; H10W 20/46; H10W 20/48; H10W 20/0245; H10W 20/217
See application file for complete search history.

(56) References Cited

U.S. PATENT DOCUMENTS

| | | | | |
|---|---|---|---|---|
| 6,214,719 | B1 | 4/2001 | Nag | |
| 7,969,013 | B2 | 6/2011 | Chen et al. | |
| 8,647,920 | B2 | 2/2014 | Tezcan et al. | |
| 8,742,590 | B2 | 6/2014 | Beyne | |
| 2012/0013022 | A1 * | 1/2012 | Sabuncuoglu Tezcan | H10W 20/023 257/774 |
| 2012/0068348 | A1 | 3/2012 | Kirby et al. | |
| 2012/0139127 | A1 * | 6/2012 | Beyne | H10W 20/023 257/E21.586 |

(Continued)

FOREIGN PATENT DOCUMENTS

CN 104078414 B 2/2017

OTHER PUBLICATIONS

Civale et al., "A Novel Concept for Ultra-Low Capacitance via-Last TSV," 2010 IEEE International 3D Systems Integration Conference (3DIC), IMEC, 4 pages.

(Continued)

*Primary Examiner* — Patricia D Valenzuela
(74) *Attorney, Agent, or Firm* — Francois Pagette; Hoffman Warnick LLC

(57) ABSTRACT

A structure includes a through semiconductor via (TSV) in a semiconductor substrate. The structure also includes a cavity including a first cavity portion in the semiconductor substrate and surrounding a middle section of the TSV and in direct contact with the TSV. The cavity also includes a plurality of second cavity portions in the semiconductor substrate and surrounding an upper section of the TSV. The semiconductor substrate is between adjacent second cavity portions, creating a bridge portion that provides structural support. The cavity reduces parasitic capacitance.

18 Claims, 7 Drawing Sheets

(56) References Cited

U.S. PATENT DOCUMENTS

| | | | |
|---|---|---|---|
| 2013/0161825 A1 | 6/2013 | Hsu et al. | |
| 2020/0161218 A1* | 5/2020 | Shank | H10D 62/115 |
| 2022/0310486 A1 | 9/2022 | Pandey et al. | |

OTHER PUBLICATIONS

Huang et al., "Implementation of Air-Gap Through-Silicon-Vias (TSVs) Using Sacrificial Technology," IEEE Transactions on Components, Packaging and Manufacturing Technology, 3:1430-38, Aug. 2013, 10 pages.

U.S. Appl. No. 18/154,481, entitled "Structure with Air Gaps Extending From Dielectric Liner Around Through Semiconductor via," filed Jan. 13, 2023, 28 pages.

U.S. Appl. No. 18/154,481, Response to Office Action filed Jul. 16, 2025, 11 pages.

U.S. Appl. No. 18/154,481, Notice of Allowance dated Jul. 31, 2025, 8 pages.

European Search Report dated Jan. 16, 2024 for EP Application 231953357.7; pp. 11.

U.S. Appl. No. 18/154,481, Office Action dated May 9, 2025, 11 pages.

* cited by examiner

STRUCTURE WITH CAVITY AROUND THROUGH SEMICONDUCTOR VIA

BACKGROUND

The present disclosure relates to semiconductor structures and, more particularly, to a structure with a cavity (e.g., air gap) in a semiconductor substrate around a through semiconductor via.

Through semiconductor vias (TSVs) are vertical electrical contacts that extend through a semiconductor substrate to allow electrical connections between integrated circuit (IC) structures on one side of the semiconductor substrate and IC structures on the other side of the semiconductor substrate. TSVs include one or more conductors. A dielectric liner surrounds the TSV. A parasitic coupling capacitance is formed by the TSV conductors and the semiconductor substrate with the dielectric liner therebetween. The parasitic coupling capacitance can increase delay and power consumption of the IC structures. It is a challenge to limit the parasitic coupling capacitance in this setting.

SUMMARY

All aspects, examples and features mentioned below can be combined in any technically possible way.

An aspect of the disclosure provides a structure comprising: a through semiconductor via (TSV) in a semiconductor substrate; and a cavity including: a first cavity portion in the semiconductor substrate and surrounding a middle section of the TSV, the first cavity portion in direct contact with the TSV, and a plurality of second cavity portions in the semiconductor substrate and surrounding an upper section of the TSV, the semiconductor substrate between adjacent second cavity portions.

An aspect of the disclosure provides a structure comprising: a through semiconductor via (TSV) in a semiconductor substrate; and a cavity including: a first cavity portion in the semiconductor substrate and surrounding a middle section of the TSV, the first cavity portion in direct contact with the TSV, and a plurality of second cavity portions in the semiconductor substrate and in fluid communication with the first cavity portion, wherein the plurality of second cavity portions surrounds an upper section of the TSV, and wherein a portion of the semiconductor substrate is between adjacent second cavity portions and between each of the plurality of second cavity portions and the TSV.

An aspect of the disclosure provides a method comprising: forming a through semiconductor via (TSV) in a frontside of a semiconductor substrate; forming a cavity, including: a first cavity portion in the semiconductor substrate and surrounding a middle section of the TSV, the first cavity portion in direct contact with the TSV, and a plurality of second cavity portions in the semiconductor substrate and surrounding an upper section of the TSV, the semiconductor substrate between adjacent second cavity portions; and planarizing a backside of the semiconductor substrate to complete the TSV.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
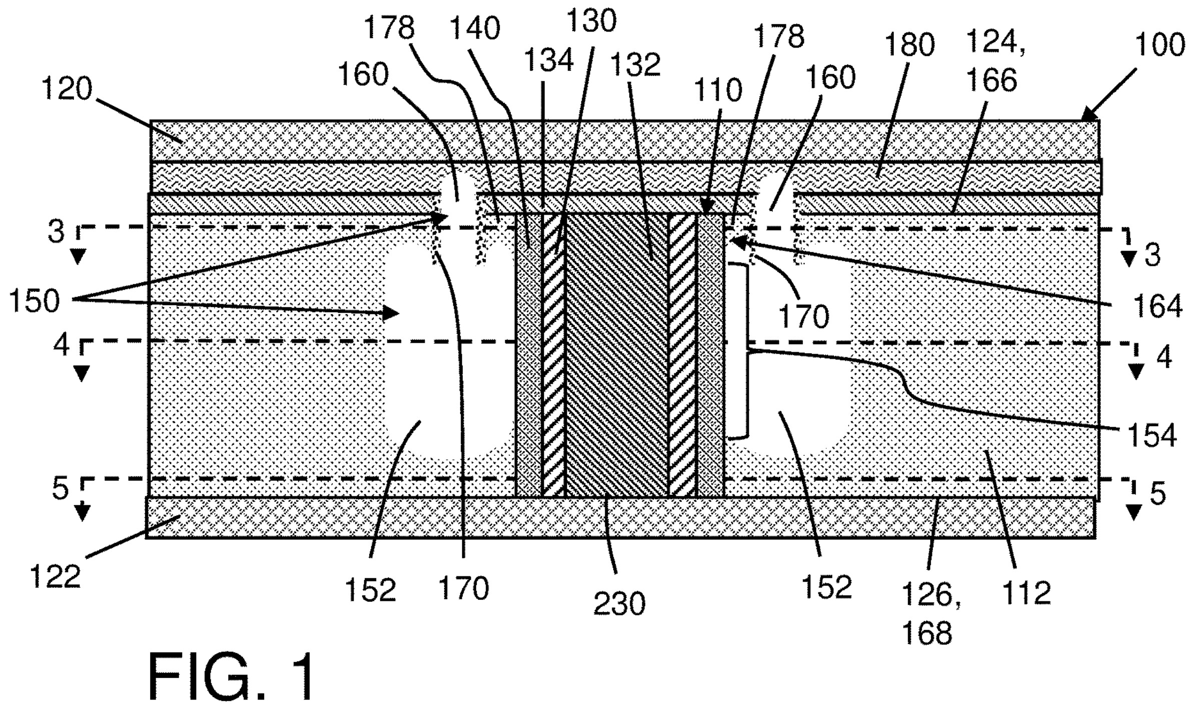
FIG. 1 shows a cross-sectional view of a structure according to embodiments of the disclosure along view line 1-1 in FIG. 3.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including a through semiconductor via (TSV) in a semiconductor substrate. The structure also includes a cavity including a first cavity (e.g., air gap) portion in the semiconductor substrate and surrounding a middle section of the TSV and in direct contact with the TSV. The cavity also includes a plurality of second cavity (e.g., air gap) portions in the semiconductor substrate and surrounding an upper section of the TSV. The semiconductor substrate extends between adjacent second cavity portions, creating a bridge portion that provides structural support. The cavity reduces the parasitic coupling capacitance of the TSV, relieves stress in the semiconductor substrate.

Figure 2:
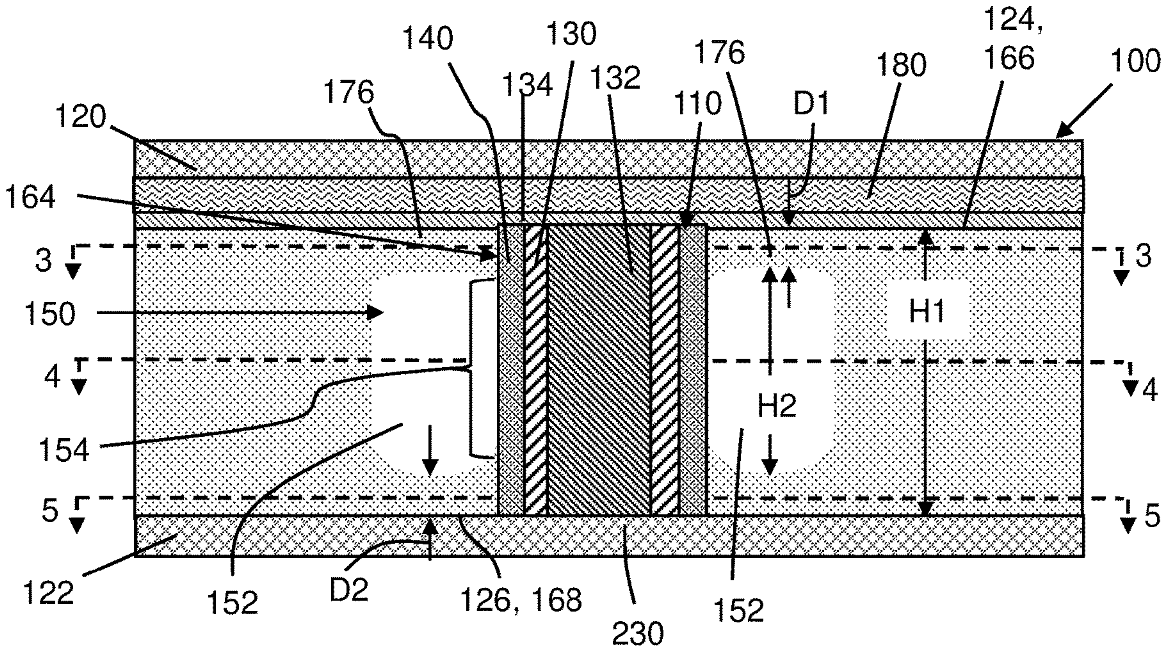
FIG. 2 shows a cross-sectional view of a structure according to embodiments of the disclosure along view line 2-2 in FIG. 3.
Figure 3:
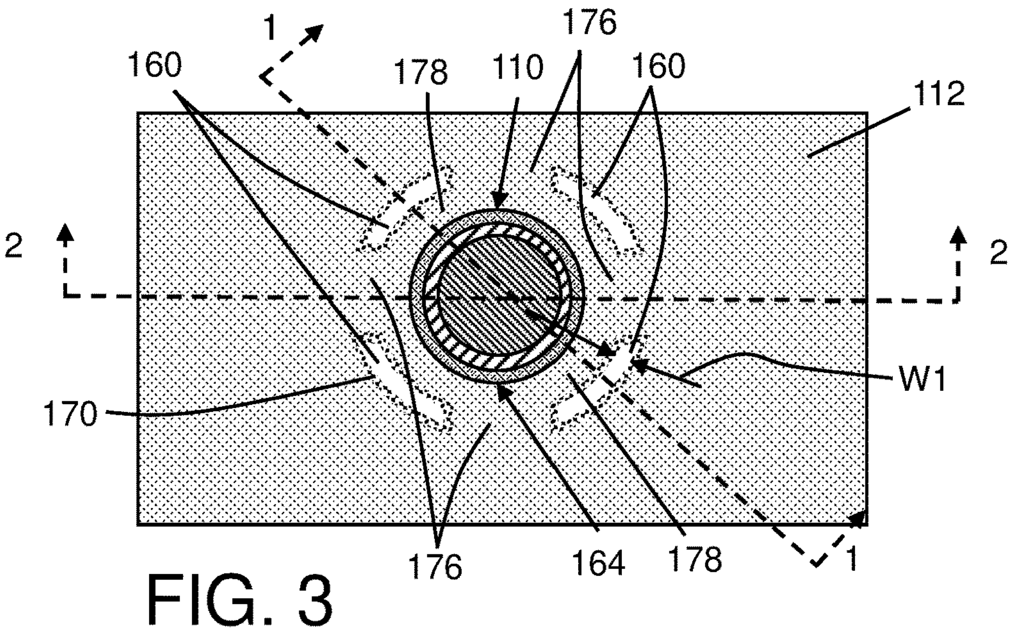
FIG. 3 shows a cross-sectional view of a structure according to embodiments of the disclosure along view line 3-3 in FIGS. 1 and 2.
Figure 4:
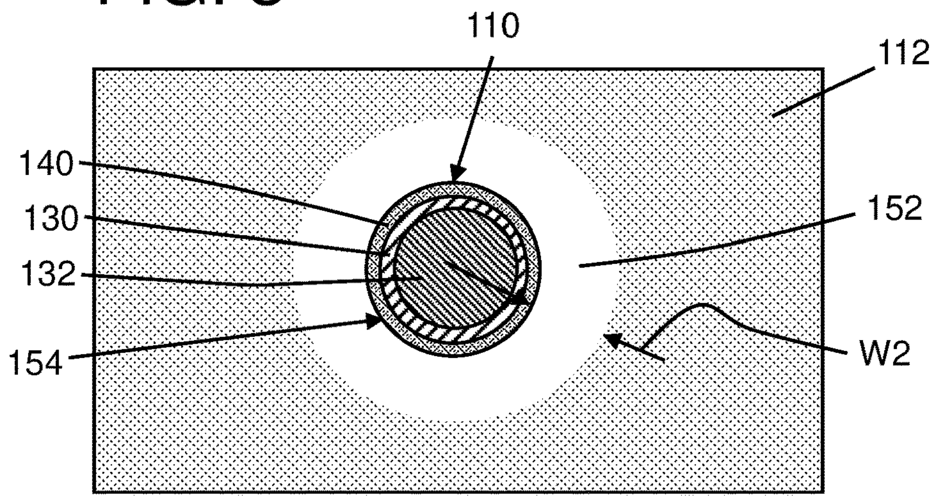
FIG. 4 shows a cross-sectional view of a structure according to embodiments of the disclosure along view line 4-4 in FIGS. 1 and 2.
Figure 5:
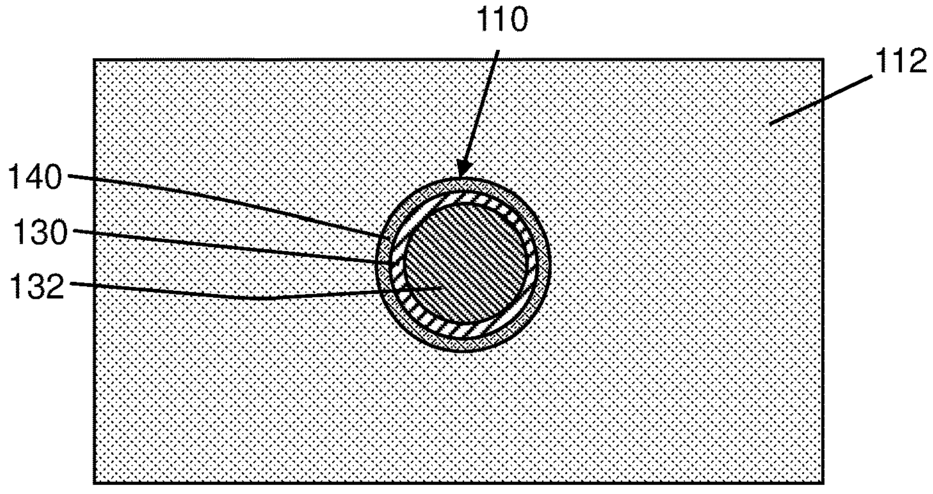
FIG. 5 shows a cross-sectional view of a structure according to embodiments of the disclosure along view line 5-5 in FIGS. 1 and 2.

FIGS. 1 and 2 show cross-sectional views of a structure 100 along view lines 1-1 and 2-2, respectively in FIG. 3, and FIGS. 3-5 show cross-sectional views of structure 100 along view lines 3-3, 4-4 and 5-5, respectively, in FIGS. 1 and 2. Structure 100 includes a through semiconductor via (TSV) 110 in a semiconductor substrate 112. Semiconductor substrate 112 may include any now known or later developed semiconductor material as described elsewhere herein.

As shown in FIG. 2, integrated circuit (IC) structures 120, 122 may be positioned on a frontside 124 and a backside 126 of semiconductor substrate 112, respectively, creating a heterogenous integrated circuit structure. IC structures 120, 122 may include any now known or later developed integrated circuitry including active, passive, photonics and/or other circuitry. In addition, IC structures 120, 122 may include any now known or later developed middle-of-line (MOL) interconnect layers and/or back-end-of-line (BEOL) interconnect layers for interconnecting components within each IC structure 120, 122.

TSV 110 may include any now known or later developed contact or via structure electrically coupling portions of IC structures 120, 122 through semiconductor substrate 112, i.e., from frontside 124 to backside 126. TSV 110 may include one or more conductors. The conductors may include, for example, a refractory metal liner 130 and a contact metal 132, collectively providing a conductor core. Refractory metal liner 130 may include, for example, ruthenium (Ru), tantalum (Ta), titanium (Ti), tungsten (W), iridium (Ir), rhodium (Rh), platinum (Pt), nitrides of the preceding list, and mixtures thereof. Contact metal 132 may include any now known or later developed contact metal such as but not limited to copper (Cu) or tungsten (W). TSV 110 may include a cap layer 134 (removed from top-down figures) thereon. While a cap layer 134 is shown as a single layer, it is understood that it may include a plurality of layers, e.g., of silicon nitride, silicon oxide and/or silicon oxynitride.

Structure 100 also may optionally include a dielectric liner 140 surrounding TSV 110 and between TSV 110 and semiconductor substrate 112. Dielectric liner 140, where provided, electrically insulates TSV 110 from semiconductor substrate 112, and may be considered part of TSV 110. Dielectric liner 140 may include any insulative material typically used to electrically isolate a TSV 110 from semiconductor substrate 112 including but not limited to an oxide such as silicon dioxide. Refractory metal liner 130 prevents electromigration of contact metal 132 into dielectric liner 140.

TSV 110 within semiconductor substrate 112, with or without dielectric liner 140, therebetween creates a parasitic coupling capacitance. More particularly, TSV 110 represents one capacitor electrode and semiconductor substrate 112 represents another capacitor electrode with dielectric liner 140, where provided, providing a capacitor dielectric. As noted, the parasitic coupling capacitance can increase delay and power consumption of IC structure 120, 122. In order to reduce an area of semiconductor substrate 112 that acts as an electrode and reduce the parasitic coupling capacitance, structure 100 according to embodiments of the disclosure includes a cavity 150 in semiconductor substrate 112. Cavity 150 may include an opening filled with a gas, such as air (air gap) or an inert gas, or a vacuum.

Cavity 150 includes two fluidly connected portions. More particularly, cavity 150 includes a (first) primary cavity portion 152 (FIGS. 1, 2 and 4) and a plurality of (second) secondary cavity portions 160 (FIGS. 1 and 3). Primary cavity portion 152 is in semiconductor substrate 112 and surrounds a (vertically) middle section 154 of TSV 110 (hereafter "TSV middle section 154"). Primary cavity portion 152 (hereafter "primary cavity portion 152") is in direct contact with TSV 110. That is, primary cavity portion 152 is in direct contact with refractory metal liner 132 or, where provided, dielectric liner 140 (latter shown). TSV 'middle' section 154 indicates some of semiconductor substrate 112 is above primary cavity portion 152, and some of semiconductor substrate 112 is below primary cavity portion 152.

Referring again to FIG. 2, cavity 150 may have a height that is selected to remove as much of semiconductor substrate 112 as possible, e.g., to reduce parasitic coupling capacitance, without causing structural issues. With regard to primary cavity portion 152, TSV middle section 154 may include any extent of a height H1 (FIG. 2) of TSV 110 desired based on, for example, the amount of parasitic capacitance reduction desired. In certain embodiments, TSV middle section 154 of primary cavity portion 152 has a height H2 (FIG. 2) and surrounds approximately 80% of height H1 of TSV 110. That is, primary cavity portion 152 is in direct contact with 80% of height H1 of TSV 110, which can reduce parasitic capacitance by, for example, approximately 80%. Height H2 of TSV middle section 154 can be identified as the extent of primary cavity portion 152 in direct contact with TSV 110, or, in other words, a length from a lower extent of semiconductor substrate 112 defining an upper end of primary cavity portion 152 next to TSV 110 to an upper extent of semiconductor substrate 112 defining a lower end of primary cavity portion 152 next to TSV 110. In one non-limiting example, primary cavity portion 152 may have height H2 in a range of 10000 nanometers (nm) to 45000 nm. Other heights are also possible depending on height H1 of TSV 110 and/or a height of semiconductor substrate 112.

Cavity 150 also includes a plurality of (second) secondary cavity portions 160 in semiconductor substrate 112 and surrounding an upper section 164 of TSV 110. Secondary cavity portions 160 are in fluid communication with primary cavity portion 152, forming a contiguous cavity 150. Upper section 164 of TSV 110 (hereafter "TSV upper section 164") is a portion between TSV middle section 154 and an upper surface 166 of semiconductor substrate 112. Semiconductor substrate 112 also has an opposing lower surface 168. Hence, TSV upper section 164 may extend from an upper end of primary cavity portion 152 next to TSV 110 to upper surface 166 of semiconductor substrate 112. In the embodiment shown in FIG. 3, plurality of secondary cavity portions 160 (hereafter "secondary cavity portions 160") includes four secondary cavity portions 160. However, as will be described further herein, different numbers of secondary cavity portions 160 can be used.

In the FIG. 3 embodiment, secondary cavity portions 160 have an elongated, curved cross-sectional shape. In the example shown, where four curved secondary cavity portions 160 are used, the radius of curvature can be, e.g., between 45° and 80°. As will be described further herein, secondary cavity portions 160 can have different shapes, e.g., circular cross-sectional shapes, among others. Secondary cavity portions 160 may or may not all have the same shape. In certain embodiments, secondary cavity portions 160 are equidistantly spaced around TSV 110; however, this is not necessary in all cases.

Each of secondary cavity portions 160 have a passivation layer 170 on a sidewall of semiconductor substrate 112. Passivation layer 170 may extend vertically adjacent TSV upper section 164 and through cap layer 134. Passivation layer 170 may include but is not limited to an oxide, such as silicon oxide.

As shown in FIG. 3, secondary cavity portions 160 have a width W1 (FIG. 3) that is sufficiently small to allow sealing of cavity 150, i.e., using a dielectric layer 180 (FIGS. 1-2). For example, in certain embodiments, each of secondary cavity portions 160 have a width of less 200 nm. Other widths W1 may also be possible depending on the material of dielectric layer 180 used to seal cavities 150. As shown in FIG. 4, primary cavity portion 152 has a width W2 that is significantly larger than width W1 (FIG. 3) of secondary cavity portions 160 (FIG. 3). Width W1 can be measured, for example, as a radial distance relative to TSV 110 between opposing sides of passivation layer 170 (see arrows in FIG. 3). Width W2 can be measured, for example, as a radial distance relative to TSV 110 between a radial outermost surface of primary cavity portion 152 and an outer surface of TSV 110 (liner 132 or liner 140) (see arrows in FIG. 4). In one non-limiting example, width W2 can be ten to twenty times that of width W1.

As shown in FIG. 3, semiconductor substrate 112 is between adjacent secondary cavity portions 160, forming semiconductor bridge portions 176 that bridge over primary cavity portion 152. Bridge portions 176 provide support for cavity 150 and structural integrity. Bridge portions 176 can be sized and shaped based on the number, size and shape of secondary cavity portions 160. In the FIG. 3 example, bridge portions 176 are radially extending straight portions of semiconductor substrate 112 between elongated, curved secondary cavity portions 160.

As shown in FIG. 2, a distance D1 between primary cavity portion 152 and upper surface 166 of semiconductor substrate 112 is in a range of 4000 to 6000 nm. Similarly, a distance D2 between primary cavity portion 152 and lower surface 168 of semiconductor substrate 112 is in a range of 4000 to 6000 nm. Portions 178 of semiconductor substrate 112 also remain between secondary cavity portions 160 and TSV 110. Hence, each of secondary cavity portions 160 are separated from TSV 110 by a portion 178 of semiconductor substrate 112.

As noted, the shape and dimensions of secondary cavity portions 160 may be limited by pinch-off capabilities for the particular dielectric layer 180 used to seal cavities 150. Dielectric layer 180 may be part of any adjacent dielectric layer to semiconductor substrate 112, e.g., a first metal layer dielectric of IC structures 120, 122 (FIG. 1). While secondary cavity portions 160 are all shown with the same width W1 and length, their widths and lengths may be different around a given TSV 110.

Figure 6:
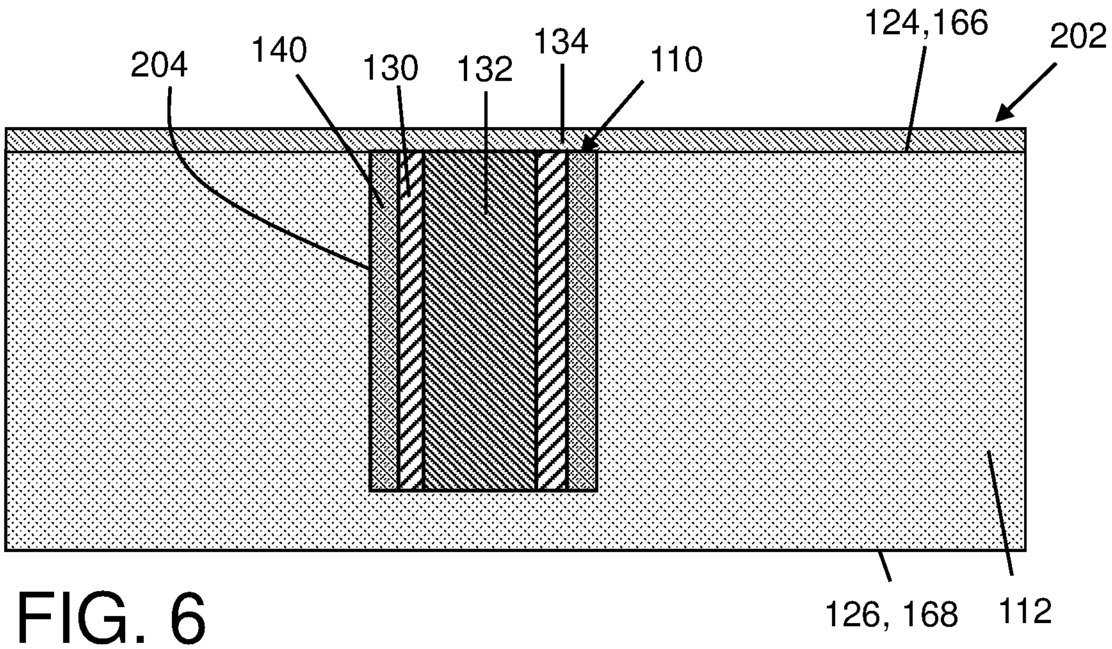
FIG. 6 shows a cross-sectional view of forming a through semiconductor via (TSV) according to embodiments of the disclosure.

FIGS. 6-7 and 9-14 show cross-sectional views of parts of a method of forming structure 100 (FIGS. 1-2) according to embodiments of the disclosure. FIGS. 8A and 8B show top-down views of a mask 200 for forming cavity openings 212 (FIGS. 9-14) used to form cavities 150, according to various embodiments of the disclosure. It will be recognized that cavities 150 can be formed in a number of ways, and the method described herein is only illustrative. FIG. 6 shows an initial structure 202 after forming TSV 110 in frontside 124 of semiconductor substrate 112. Semiconductor substrate 112 can be provided in any now known or later developed fashion and may include any variety of dopants required for the active circuitry of IC structures 120, 122 formed on/in frontside 124 and on/in backside 126 thereof. TSV 110 may be formed, for example, by forming a TSV opening 204 in semiconductor substrate 112 using any now known or later developed semiconductor fabrication techniques, e.g., patterning a mask (not shown) and etching TSV opening 204 into semiconductor substrate 112. Where provided, dielectric liner 140 may then be deposited into TSV opening 204, e.g., using chemical vapor deposition. TSV 110 conductors such as refractory metal liner 130 and contact metal 132 can be deposited, e.g., using CVD or other appropriate deposition techniques. Subsequently, a planarization, e.g., chemical mechanical polishing (CMP), is performed to remove excess materials. Thereafter, cap layer 134 of, e.g., silicon nitride, silicon oxide and/or silicon oxynitride, may be formed thereover by any appropriate deposition technique, e.g., CVD. As noted, while cap layer 134 is shown as a single layer, it is understood that it may include a plurality of layers. At this stage, TSV 110 does not extend through backside 126 of semiconductor substrate 112.

FIGS. 7-14 show a method of forming cavities 150 (FIGS. 1-2) in semiconductor substrate 112 according to embodiments of the disclosure. Forming cavities 150 (FIGS. 1-2) includes forming (first) primary cavity portion 152 in semiconductor substrate 112 and surrounding TSV middle section 154 and in direct contact with TSV 110, i.e., refractory metal liner 132 or dielectric liner 140 thereof. Forming cavities 150 also includes forming plurality of (second) secondary cavity portions 160 in semiconductor substrate 112 and surrounding TSV upper section 164 with semiconductor substrate 112 between adjacent secondary cavity portions 160, i.e., bridge portions 176 between adjacent secondary cavity portions 160.

Figure 7:
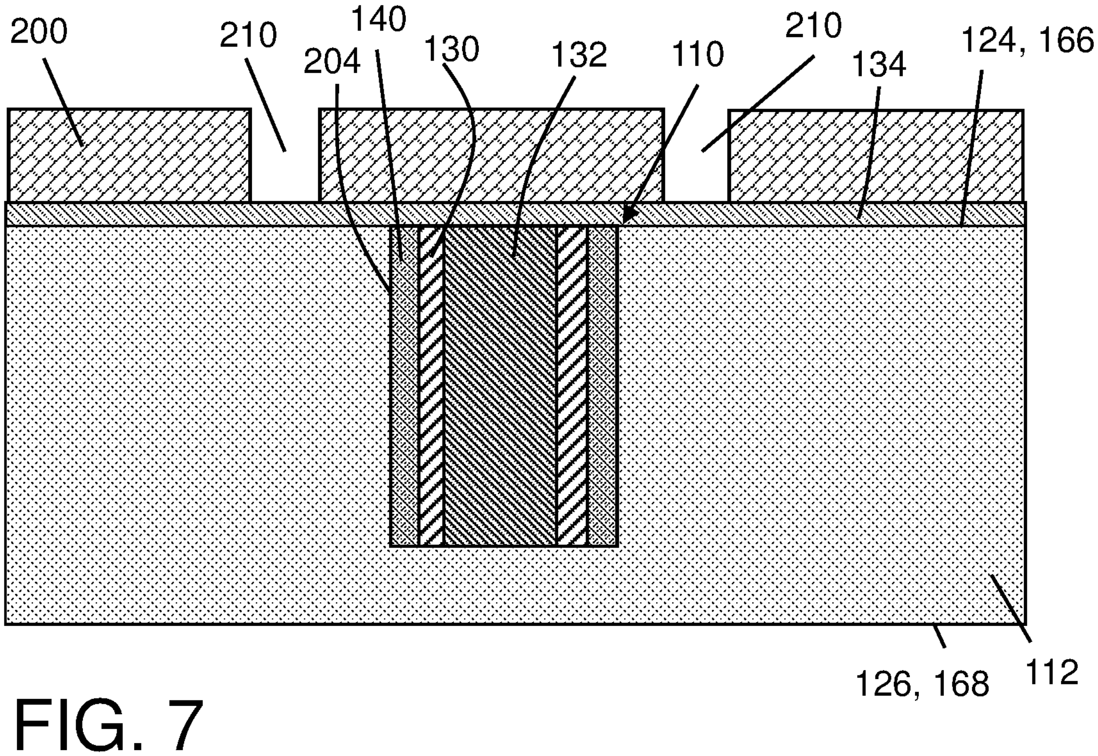
FIG. 7 shows a cross-sectional view of forming a mask according to embodiments of the disclosure.
Figure 8A:
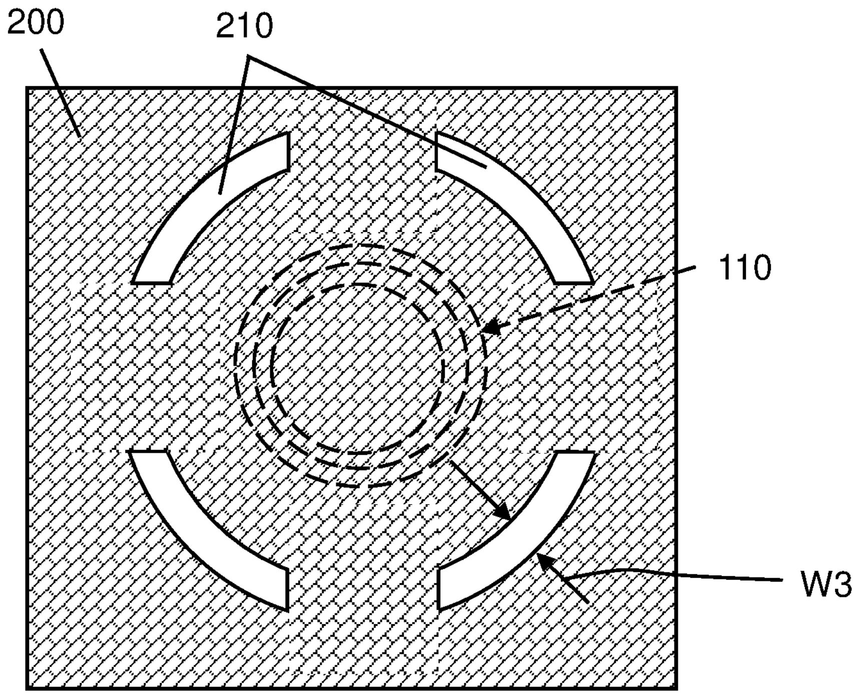
FIG. 8A shows a top-down view of an illustrative mask for forming the structure in FIGS. 1 and 2 according to embodiments of the disclosure.
Figure 8B:
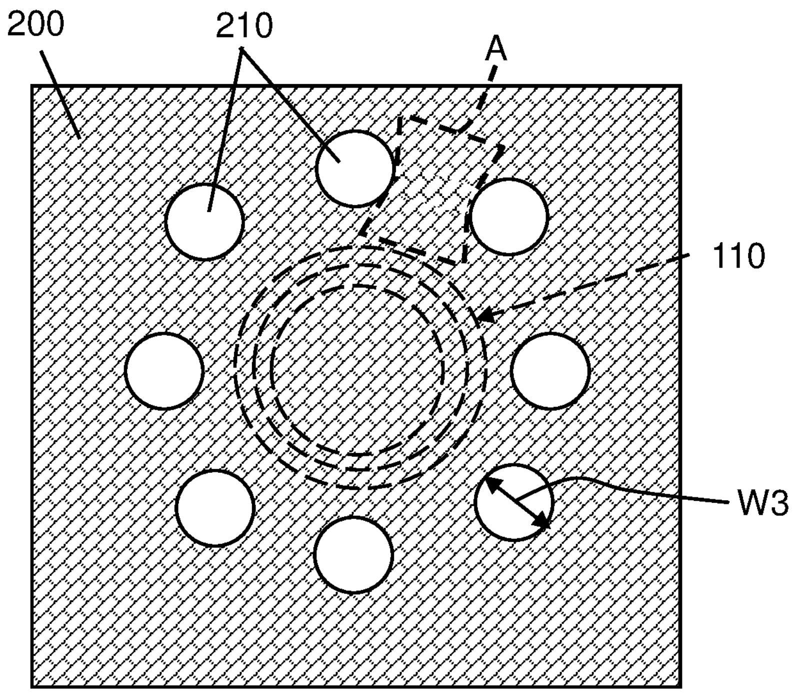
FIG. 8B shows a top-down view of an illustrative mask for forming the structure in FIGS. 1 and 2 according to other embodiments of the disclosure.

FIGS. 7, 8A-B and 9 show forming a plurality of (cavity) openings 212 (FIG. 9) in semiconductor substrate 112 around TSV 110. FIG. 7 shows patterning a mask 200 to include mask openings 210 for forming cavities 150 (FIGS. 1-2). As noted, FIGS. 8A-8B shows a top-down view of mask 200 for forming cavity openings 212 (FIG. 9) in semiconductor substrate 112. While some illustrative arrangements of mask openings 210 and cavity openings 212 will be described herein, the openings 210, 212 can have any arrangement, e.g., number, shape and/or dimensions, that allow formation of primary cavity portion 152 in direct contact around an entirety of TSV 110 and retention of bridge portions 176 to provide structural integrity and support for cavities 150.

FIG. 8A shows mask 200 having mask openings 210 for forming elongated, curved cross-sectional shaped secondary cavity portions 160 (FIGS. 1, 3), i.e., with cavity openings 212 having that shape. FIG. 8B shows mask 200 having mask openings 210 for forming a circular cross-sectional shape of secondary cavity portions 160 (FIGS. 1, 3), i.e., with cavity openings 212 (FIG. 9) having that shape. In FIG. 8A, four mask openings 210 are shown and in FIG. 8B, eight mask openings 210 are shown. However, a different number of mask openings 210 in mask 200 can be used, i.e., to create any number of secondary cavity portions 160. In the FIG. 8A embodiment, where four curved secondary cavity portions 160 are desired, four mask openings 210 of similar configuration are used in mask 200. As noted, the radius of curvature can be, e.g., between 45° and 80°. Mask openings 210, like secondary cavity portions 160, do not all have to be the same shape. In certain embodiments, mask openings 210 are, like secondary cavity portions 160, equidistantly spaced around TSV 110; however, this is not necessary in all cases. Mask openings 210 have dimensions, such as a width W3 (FIGS. 8A-B) (i.e., diameter in FIG. 8B), that are sized to ensure secondary cavity portions 160 can be sealed using a dielectric layer 180 (FIGS. 1-2). (Width W3 can be measured in a radial direction relative to TSV 110). For example, mask openings 210 have dimensions to ensure each of secondary cavity portions 160 (FIGS. 1-2) have a width of less 200 nm after formation as described herein. Other widths W1 may also be possible depending on dielectric layer 180 (FIGS. 1-2) used to seal cavities 150. Where the FIG. 8B arrangement is used, bridge portions 176 (FIG. 2) may have an hourglass shape (see dashed box A) extending between elongated, curved secondary cavity portions 160 (after the latter is formed).

Figure 9:
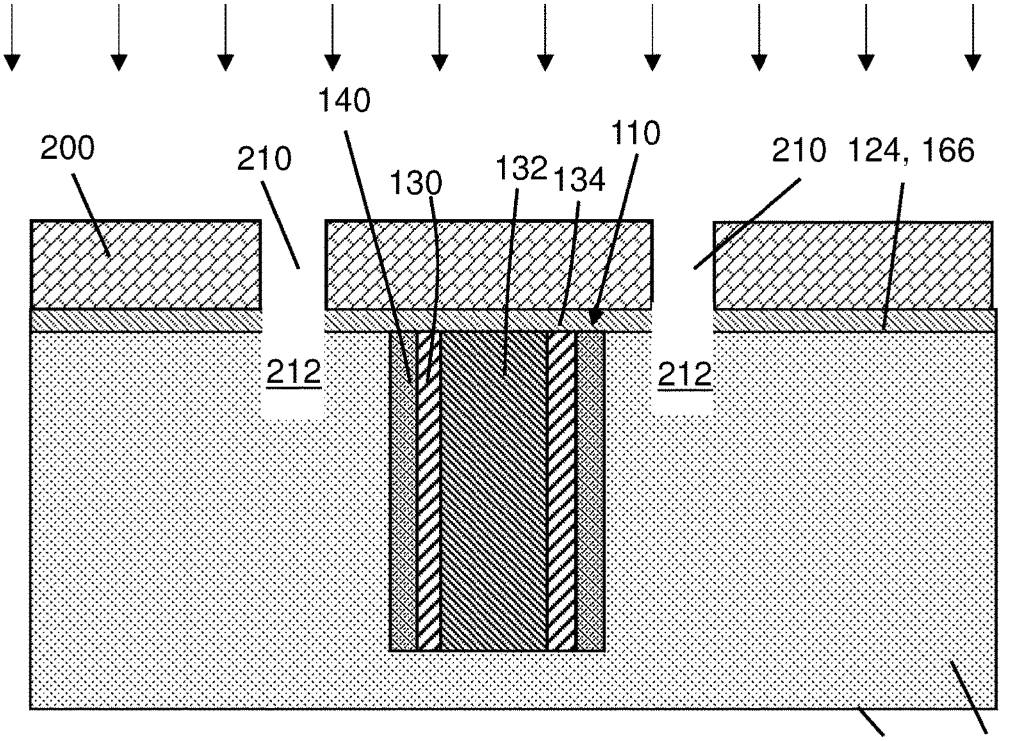
FIG. 9 shows a cross-sectional view of forming a plurality of openings for a portion of a cavity according to embodiments of the disclosure.

Mask 200 may include any appropriate masking material, e.g., a hard mask such as silicon nitride. As shown in FIGS. 8A-B, mask openings 210 in mask 200 are configured to form cavity openings 212 (FIG. 9) in the desired pattern about TSV 110. It will be recognized by those with skill in the art that mask openings 210 in mask 200 can be arranged to form cavities 150 as illustrated in any embodiment herein. FIG. 9 shows the structure after etching cavity openings 212 into semiconductor substrate 112. The etching chemistry and duration can be arranged such that cavity openings 212 penetrate partially into semiconductor substrate 112. The etching step may also remove any photoresist (not shown) used to form mask 200. The etching may include any appropriate etching chemistry for the materials to be etched, such as but not limited to a reactive ion etch (RIE). Again, mask openings 210 and cavity openings 212 can have any arrangement, e.g., number, shape and/or dimensions, that allow formation of primary cavity portion 152 in direct contact around an entirety of TSV 110 and retention of bridge portions 176 to provide structural integrity and support for cavities 150.

Figure 10:
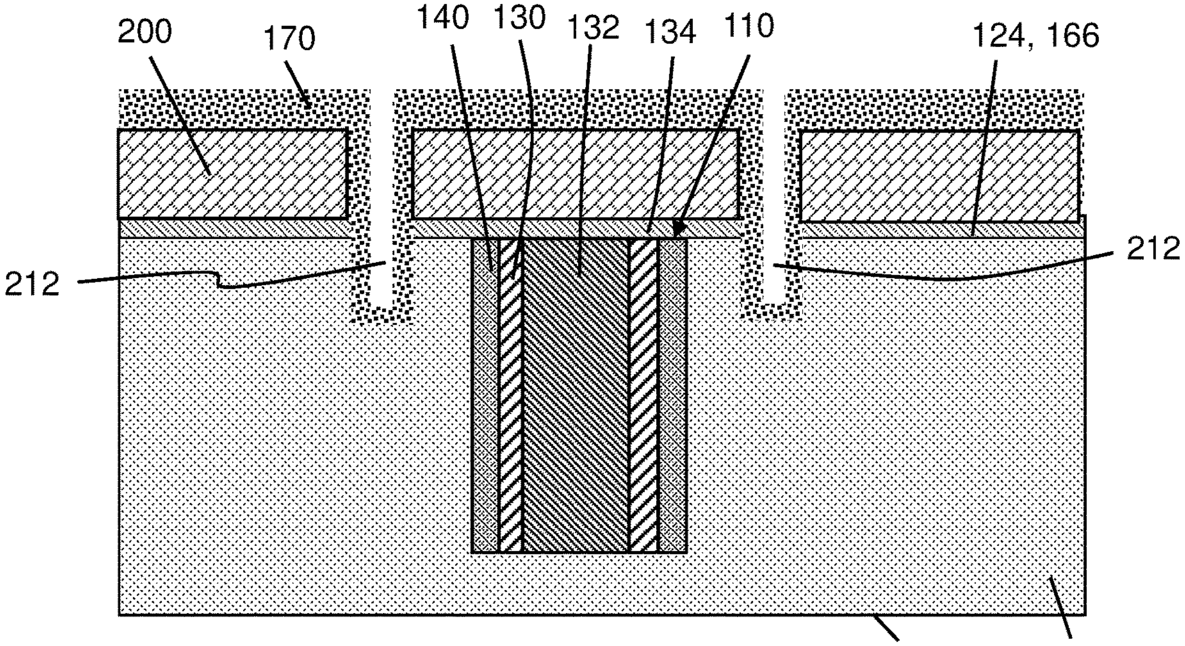
FIG. 10 shows a cross-sectional view of forming a passivation layer in the plurality of openings according to embodiments of the disclosure.
Figure 11:
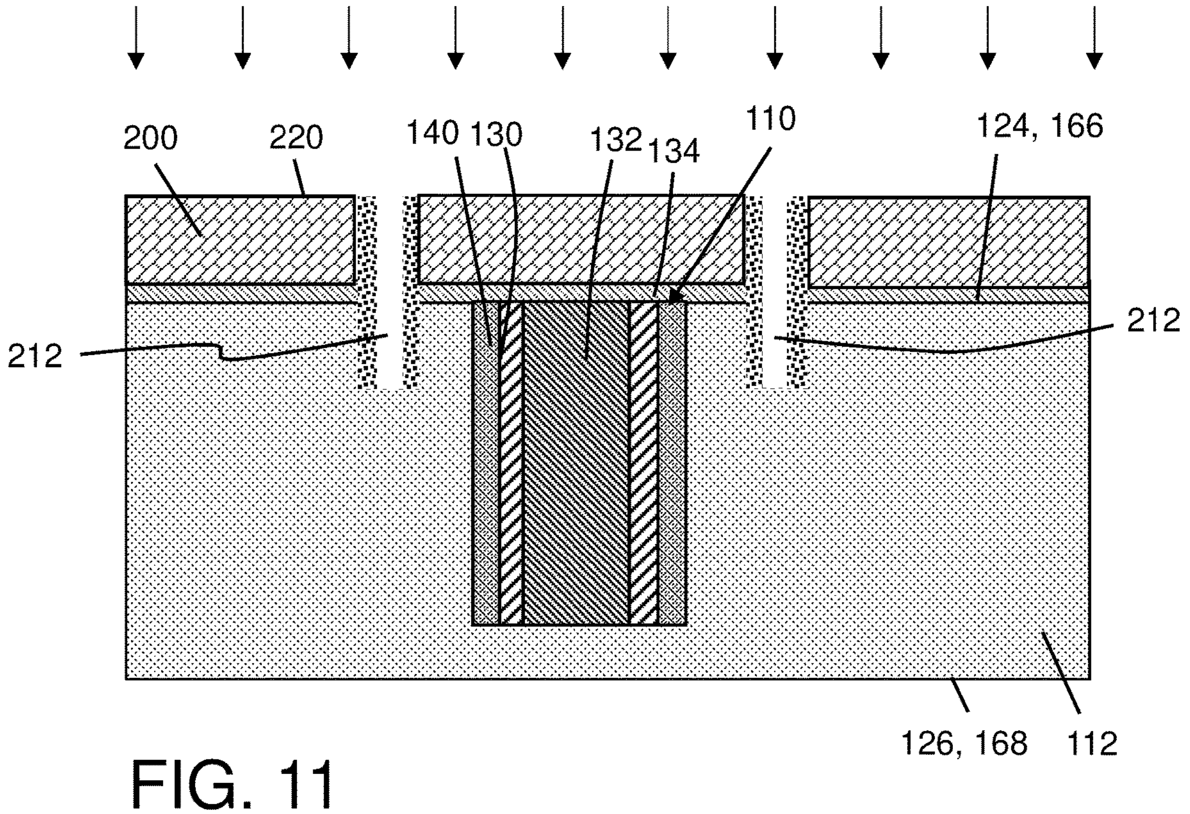
FIG. 11 shows a cross-sectional view of removing the passivation layer at a bottom of the plurality of openings according to embodiments of the disclosure.

FIGS. 10-11 show forming passivation layer 170 on a sidewall of each of the plurality of cavity openings 212 in semiconductor substrate 112. FIG. 10 shows depositing passivation layer 170, which is conformal and coats a sidewall of cavity openings 212. Passivation layer 170 may include any material capable of protecting the sidewalls of cavity openings 212 and semiconductor substrate 112 from subsequent etching steps, such as but not limited to silicon oxide. FIG. 11 shows etching back passivation layer 170 to remove it from a bottom of cavity openings 212 and an upper surface 220 of mask 200. The etch back may include any directional etching chemistry for the passivation layer 170 material, such as but not limited to a RIE.

Figure 12:
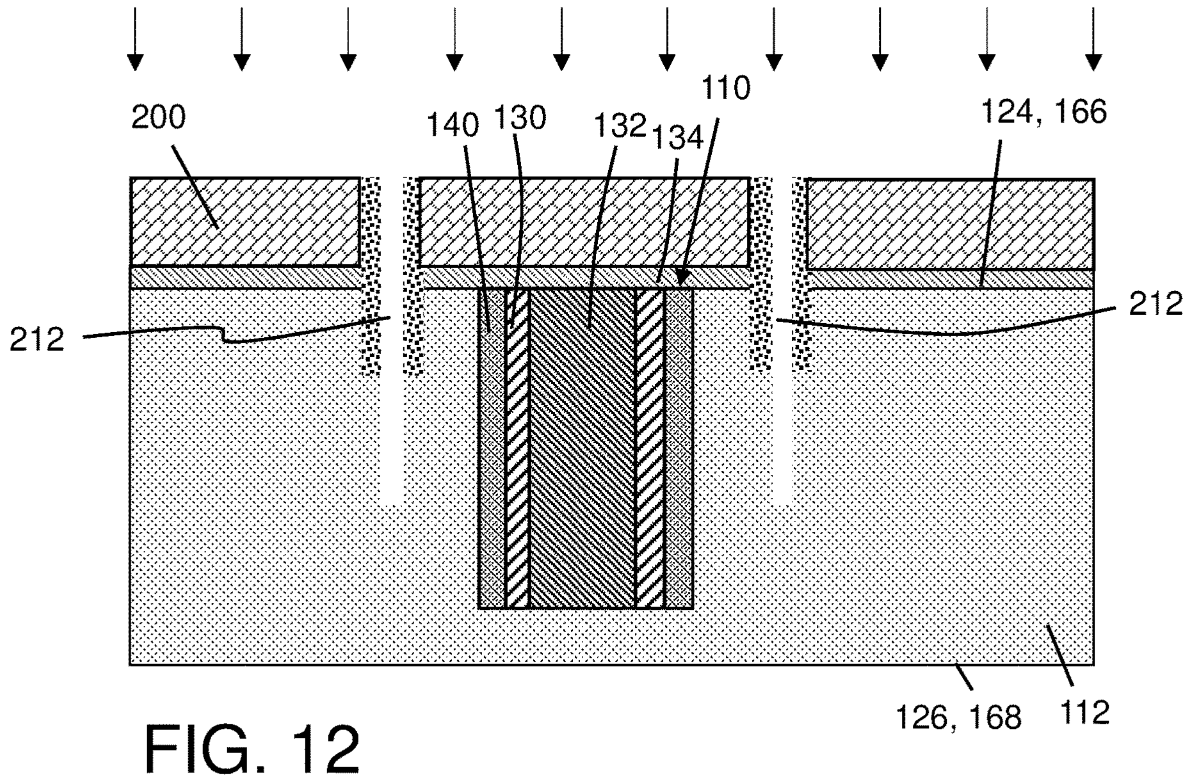
FIG. 12 shows a cross-sectional view of extending the plurality of openings according to embodiments of the disclosure.
Figure 13:
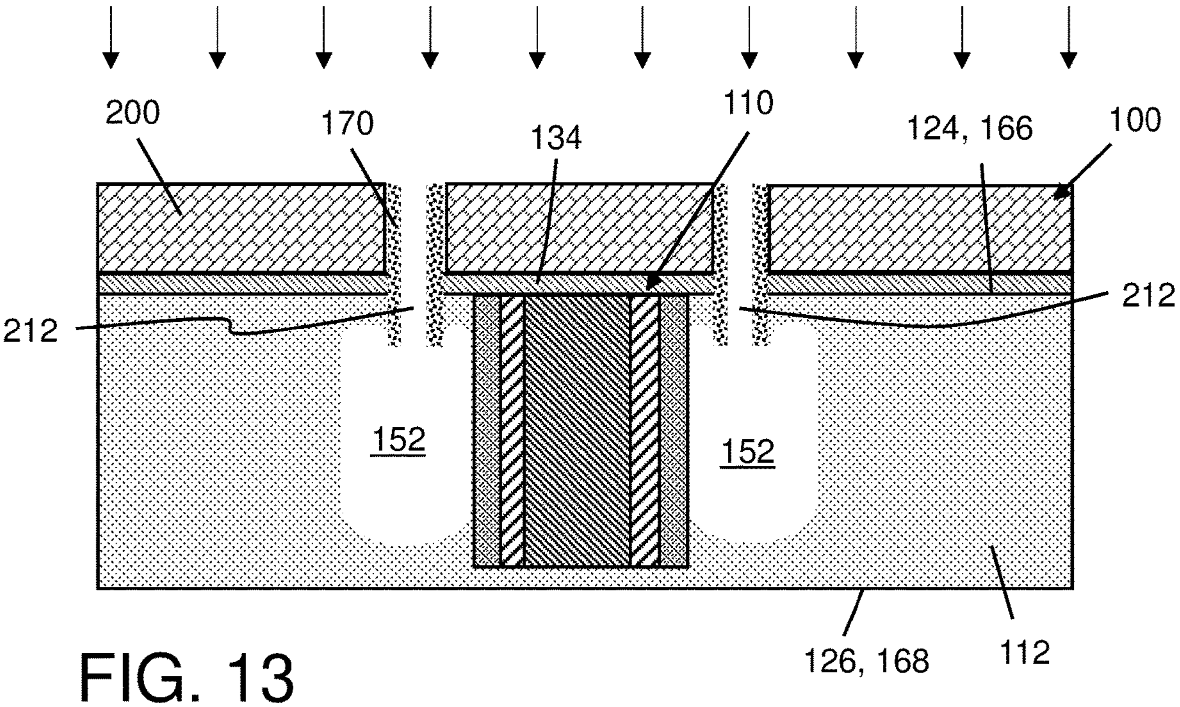
FIG. 13 shows a cross-sectional view of forming another portion of the cavity according to embodiments of the disclosure.
Figure 14:
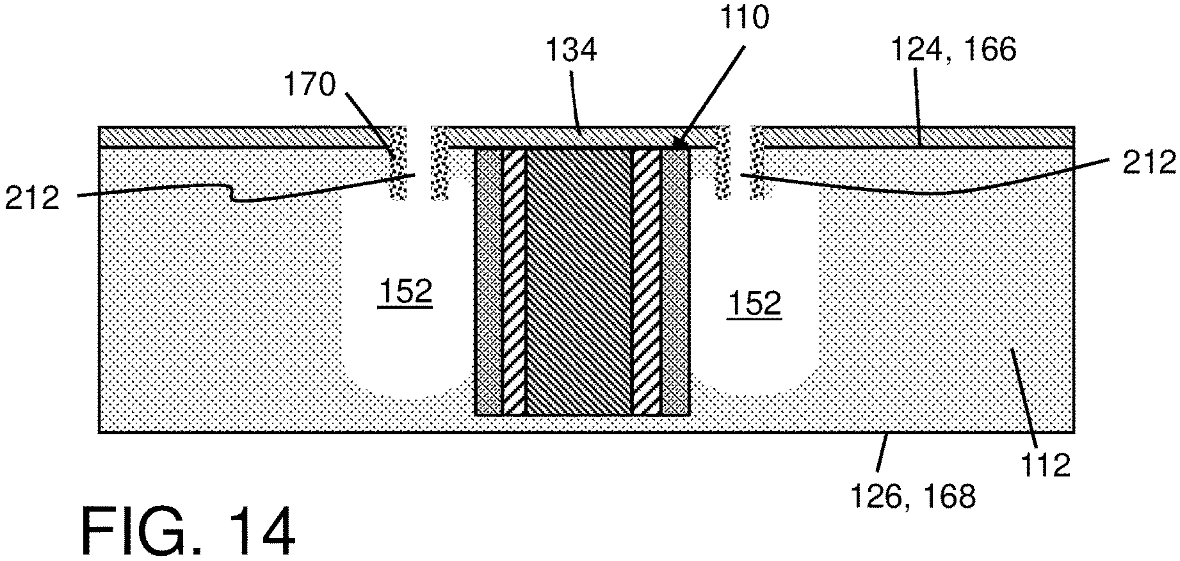
FIG. 14 shows a cross-sectional view of removing a mask according to embodiments of the disclosure.

FIGS. 12-14 show forming (first) primary cavity portion 152 through plurality of cavity openings 212, i.e., to form the open space that will eventually be primary cavity portion 152 once the space is sealed. FIG. 12 shows extending cavity openings 212 farther into semiconductor substrate 112, e.g., beyond a lower end of passivation layer 170. The etching chemistry may include any directional etching chemistry for semiconductor substrate 112 material, such as but not limited to a dry RIE and associated cleaning process.

FIG. 13 shows etching to form primary cavity portion 152, i.e., by widening the extended cavity openings 212 in FIG. 12. This etching process may include an isotropic etching chemistry such as but not limited to sulfur hexafluoride and oxygen ($SF_6$—$O_2$) or tetramethylammonium hydroxide (TMAH) chemistry. The etching process removes any semiconductor substrate 112 contacting TSV 110 and undercuts bridge portions 176—see curved upper areas of primary cavity portion 152 adjacent passivation layer 170. As noted, the number, shape and/or dimensions of cavity openings 212 ensure formation of primary cavity portion 152 in direct contact around an entirety of TSV 110 and retention of bridge portions 176 to provide structural integrity and support for cavities 150.

FIG. 14 shows removing mask 200. Mask 200 may be removed using any known removal process appropriate for the mask material, e.g., a wet etch for hard nitride mask.

FIGS. 1 and 2 show cross-sectional views of structure 100 after forming dielectric layer 180 to seal plurality of cavity openings 212 (FIG. 14) to form cavity 150. Dielectric layer 180 may be formed by any appropriate deposition technique for the layer, e.g., chemical vapor deposition. Cavities 150 can have any arrangement, as described herein. For example, individually, each cavity 150 has primary cavity portion 152 directly contacting TSV 110 (e.g., refractory metal liner 132 or, where provided, dielectric liner 140) and secondary cavity portions 160 spaced (uniformly or non-uniformly) around TSV 110. Dielectric layer 180 may include any now known or later developed dielectric material capable of pinching off or sealing cavities 150, as shown in FIGS. 1-2. Dielectric layer 180 may include, for example, an interlayer dielectric such as but not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzo cyclobutene (BCB)-based polymer dielectrics, and any silicon-containing low-k dielectric. Dielectric layer 180 may be the dielectric for, for example, a first metal or first via layer of IC structure 120 to be subsequently formed on frontside 124 of semiconductor substrate 112.

FIGS. 1-2 also show structure 100 after planarizing backside 126 of semiconductor substrate 112 to complete TSV 110, e.g., by CMP. In a known fashion, the planarization exposes a bottom surface 230 of TSV 110 for electrical interconnection to IC structure 122 on backside 126 of semiconductor substrate 112. FIGS. 1-2 also schematically show the formation of IC structures 120, 122 in a known fashion. As the details of forming IC structures 120, 122 are well known, no further detail is necessary for understanding by those with ordinary skill in the art.

Embodiments of the disclosure provide various technical and commercial advantages, examples of which are discussed herein. The structure described herein provides lowered parasitic capacitance coupling between TSVs and a semiconductor substrate in which the TSVs are positioned. The cavities reduce an area of the semiconductor substrate acting as a capacitor electrode. In certain embodiments, approximately 80% reduction in parasitic capacitance coupling compared to a no cavity embodiment has been observed. The structure also advantageous provides stress relaxation in the semiconductor substrate. However, the use of secondary cavity portions around an upper section of the TSV with semiconductor bridge portions therebetween provides structural integrity.

Semiconductor substrate 112 includes a layer of material whose conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants in semiconductor substrate 112 may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region of substrate 112. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related and within any appropriate semiconductor fabrication tolerances. Accordingly, a value modified by a term or terms, such as "about", "approximately" and "substantially", are not to be limited to the precise value specified. In at least some instances, the approximating language may correspond to the precision of an instrument for measuring the value. The approximating language as used throughout the specification and claims may be applied to modify any quantitative representation (value or range) that could permissibly vary without resulting in a change in the basic function to which it is related and is within any appropriate semiconductor fabrication tolerances. Here and throughout the specification and claims, range limitations may be combined and/or interchanged, such ranges are identified and include all the sub-ranges contained therein unless context or language indicates otherwise.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:

a through semiconductor via (TSV) in a semiconductor substrate; and a cavity including:

a first cavity portion in the semiconductor substrate and surrounding a middle section of the TSV, the first cavity portion in direct contact with the TSV, and a plurality of second cavity portions in the semiconductor substrate and surrounding an upper section of the TSV, the semiconductor substrate between adjacent second cavity portions wherein each of the plurality of second cavity portions laterally abuts a passivation layer embedded within the semiconductor substrate and an upper surface of the plurality of second cavity portions is horizontally distal to and vertically above an upper section of the TSV.

2. The structure of claim 1, wherein the TSV includes a dielectric liner surrounding a conductor core and wherein the first cavity portion is in direct contact with the dielectric liner.

3. The structure of claim 1, wherein each of the plurality of second cavity portions have an elongated, curved cross-sectional shape.

4. The structure of claim 1, wherein each of the plurality of second cavity portions have a circular cross-sectional shape.

5. The structure of claim 1, wherein the first cavity portion surrounds approximately 80% of a height of the TSV.

6. The structure of claim 1, wherein each of the plurality of second cavity portions have a width of less 200 nanometers (nm).

7. The structure of claim 1, wherein each of the plurality of second cavity portions are separated from the TSV by a portion of the semiconductor substrate.

8. The structure of claim 1, wherein the plurality of second cavity portions are equidistantly spaced around the TSV.

9. The structure of claim 1, wherein a distance between the first cavity portion and a lower surface of the semiconductor substrate is in a range of 4000 to 6000 nm.

10. The structure of claim 1, wherein a distance between the first cavity portion and an upper surface of the semiconductor substrate is in a range of 4000 to 6000 nm.

11. The structure of claim 1, wherein the passivation layer extends horizontally over the TSV.

12. A structure, comprising:

a through semiconductor via (TSV) in a semiconductor substrate; and a cavity including:

a first cavity portion in the semiconductor substrate and surrounding a middle section of the TSV, the first cavity portion in direct contact with the TSV, and a plurality of second cavity portions in the semiconductor substrate and in fluid communication with the first cavity portion, wherein the plurality of second cavity portions surrounds an upper section of the TSV, wherein a portion of the semiconductor substrate is between adjacent second cavity portions and between each of the plurality of second cavity portions and the TSV, and wherein each of the plurality of second cavity portions laterally abuts a passivation layer embedded within the semiconductor substrate and an upper surface of the plurality of second cavity portions is horizontally distal to and vertically above the upper section of the TSV.

13. The structure of claim 12, wherein the TSV includes a dielectric liner surrounding a conductor core and wherein the first cavity portion is in direct contact with the dielectric liner.

14. The structure of claim 12, wherein each of the plurality of second cavity portions have one of: an elongated, curved cross-sectional shape and a circular cross-sectional shape.

15. The structure of claim 12, wherein the first cavity portion surrounds approximately 80% of a height of the TSV.

16. The structure of claim 12, wherein each of the plurality of second cavity portions have a passivation layer on a sidewall of the semiconductor substrate.

17. The structure of claim 12, wherein the plurality of second cavity portions are equidistantly spaced around the TSV.

18. The structure of claim 12, wherein a first distance between the first cavity portion and a lower surface of the semiconductor substrate is in a range of 4000 to 6000 nm, and a second distance between the first cavity portion and an upper surface of the semiconductor substrate is in a range of 4000 to 6000 nm.

* * * * *